HIGH VOLTAGE RECTIFIER HAVING CONTROLLED CURRENT LEAKAGE

Filed May 24, 1965 2 Sheets-Sheet 1

WITNESSES

Theodore F. Wrobel

Donald M. Winegar

INVENTORS
Robert L. Eisner
& Horacio E. Suarez
BY
C. L. Menzemer
ATTORNEY

HIGH VOLTAGE RECTIFIER HAVING CONTROLLED CURRENT LEAKAGE

Filed May 24, 1965 2 Sheets-Sheet 2

United States Patent Office 3,343,050

Patented Sept. 19, 1967

3,343,050

HIGH VOLTAGE RECTIFIER HAVING CONTROLLED CURRENT LEAKAGE

Robert L. Eisner and Horacio E. Suarez, Pittsburgh, Pa., assignors to Westinghouse Electric Corporation, Pittsburgh, Pa., a corporation of Pennsylvania Filed May 24, 1965, Ser. No. 458,241
9 Claims. (Cl. 317—234)

ABSTRACT OF THE DISCLOSURE

This invention provides a high voltage rectifier having controlled current leakage. The current leakage is controlled by incorporating an integral peripheral shoulder in the semiconductor element of the rectifier. The top surface of the shoulder is approximately 1 to 1.5 millimeters in width and is a constant predetermined distance from the p-n junction of the element. The constant predetermined distance has a maximum value equal to approximately $$\frac{4\times10^{15}}{N}$$

microns, wherein N is the doping value expressed in atoms per cubic centimeter of the region of semiconductivity which includes that portion of the shoulder between the p-n junction and the top surface of the shoulder.

This invention relates to an improved semiconductor device suitable for use as a high voltage rectifier and a method for producing the same.

A high voltage rectifier must be able to withstand high voltage surges inherently impressed upon its electrical system.

It is well known that high voltage silicon rectifiers often fail because of a voltage breakdown which occurs at the edge of the silicon wafer where the p-n junction, or semiconductor transition region, intersects the surface of the wafer. One reason for this breakdown occurrence is that the electric field is normally higher across the edge of a p-n junction plane than it is at the center of the same p-n junction plane. This distribution of electric field concentration results from simple geometrical effects and is particularly true when the p-n junction plane is a normal cross-sectional plane of a simple cylindrical wafer.

Another reason for a breakdown failure to occur at the edge of a p-n junction plane, where it intersects the surface of a wafer, is that the surface properties of silicon wafers are different from its bulk properties. Even when excluding crystalline damage, which in itself can have a very strong influence on the device characteristics, surface contaminants, or even intentionally applied protective coatings, of a silicon wafer can give rise to current leakage. These current leakages can, in turn, trigger localized, premature, non-spreading available breakdowns culminating in a complete failure of the high voltage silicon rectifier.

Heretofore, previous solutions for preventing the previously described failures which occur in high voltage silicon rectifiers involved a departure from the "simple cylinder" geometry for a silicon wafer. The reshaping of the geometrical form of the silicon wafer enabled one to achieve a smaller electric field intensity at the edge of the wafer than that electric field intensity which existed simultaneously in the interior of the wafer.

One approach for reducing the edge electrical field intensity is to provide the wafer with a sloping edge or shoulder. The sloping edge of the wafer is designed to intersect the p-n junction at an angle of about 12°. This sloping shoulder requires a rather precise manufacturing technique and results in an easily damaged device. The resulting product also has inconsistent voltage ranges.

It is an object of this invention to provide a semiconductor device in which the electric field intensity at the edge of the device is less than the electric field intensity in the interior of the device and in which the p-n junction plane extends uninterruptedly across the entire width of the device.

A further object of this invention is to provide a semiconductor device suitable for use as a high voltage rectifier in which a shoulder limits the electric field intensity at the edge of the device while achieving a higher ratio of active p-n junction area to the total device area available.

Other objects of this invention will, in part be obvious and will, in part, appear hereinafter.

For a better understanding of the nature and objects of the present invention, reference should be had to the following detailed description and drawings, in which.

In accordance with the present invention and the attainment of the foregoing objects, there is provided a semiconductor device suitable for use as a high voltage rectifier.

The semiconductor device comprises a body of single crystal semiconductor material. The body of single crystal semiconductor material has a top surface and a bottom surface with a peripheral shoulder about, and integral with, the bottom surface.

The peripheral shoulder has an upper surface of a lesser area than the top surface of the body of single crystal semiconductor material.

The body of single crystal semiconductor material comprises a first layer of a first type of semiconductivity, a second layer of a second type of semiconductivity and a p-n junction, or semiconductor transition region formed at the interface of the first and second layers of semiconductivities. The first layer of first type semiconductivity extends from the p-n junction to the top surface of the body of single crystal semiconductor material, including the top surface of the peripheral shoulder, and the second layer of second type semiconductivity extends from the p-n junction to the bottom surface of the body of single crystal semiconductor material.

The lower portion of the body of semiconductor material includes the peripheral shoulder and contains all of the second layer of second type semiconductivity, the p-n junction and a portion of the first layer of first type semiconductivity.

Figure 1:
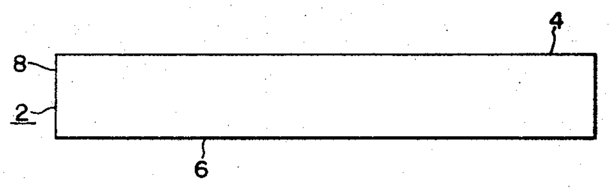
FIGURE 1 is a side view of a body of semiconductor material.

With reference to FIG. 1, there is shown a side view of a body 2 of single crystal semiconductor material. The body 2 has a top surface 4, a bottom surface 6 and a side surface 8.

The body 2 may be of any suitable semiconductor material such for example as silicon, germanium, silicon carbide, compounds of group III and group V elements and compounds of group II and group VI elements.

In order to more fully describe the invention, the body 2 will be described as being of single crystal, high resistivity n-type silicon.

Figure 2:
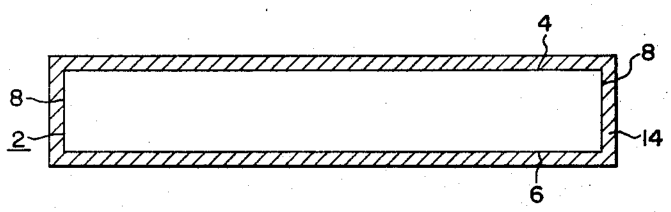
FIGS. 2 through 4 are a series of cross-sectional views of the body of semiconductor material of FIG. 1 being processed in accordance with the teachings of this invention.

With reference to FIG. 2, an oxide layer 14, in this instance silicon oxide, is formed over the entire surface of the body 2. The oxide layer 14 is produced by any suitable means known to those skilled in the art, such for example as heating the body 2 in a suitable wet atmosphere.

Figure 3:
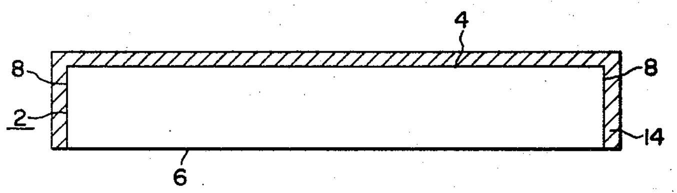

With reference to FIG. 3, a portion of the oxide layer 14 is preferentially removed to expose the bottom surface 6.

Figure 4:
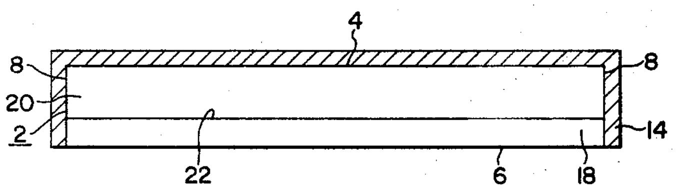

With reference to FIG. 4, a suitable p-type dopant is introduced through the bottom surface 6 to form a layer 18 of p-type semiconductivity within the body 2. The doping may be accomplished by any suitable process known to those skilled in the art, such as for example, alloying, diffusion, epitaxy, combinations thereof and the like.

The body 2 now consists of a layer 20 of n-type semiconductivity, the layer 18 of p-type semiconductivity and a p-n junction 22, or semiconductor transition region, at the interface, or boundary, between the layer 20 and the layer 18.

Figure 5:
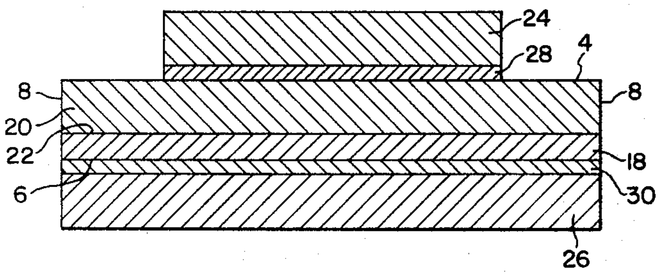
FIGS. 5 and 6 are side views in cross-section of the body of FIGS. 1 through 4 being processed into a semiconductor device in accordance with the teachings of this invention.

With reference to FIG. 5, all the remaining silicon oxide layer 14 is removed and electrical contacts 24 and 26 are affixed to surfaces 4 and 6 respectively. The metal electrical contacts may be comprised of any suitable metal such for example molybdenum, tungsten, tantalum and combinations and base alloys thereof.

The contact 24 is affixed to the surface 4 by a solder layer 28. The contact 26 is affixed to the surface 6 by a solder layer 30. The solder layers 28 and 30 comprise a suitable solder such for example as a silver or a gold base solder having a melting point above about 372° C. and known to those skilled in the art as a "hard solder." A solder having a melting point below about 372° C., and known to those skilled in the art as a "soft solder," may also be used. Such "soft solders" are usually, but need not be, lead base solders.

It will be understood of course that the particular type of solder will depend on the anticipated operating range of the finished semiconductor device.

It will be further appreciated that the contacts may be affixed by processes other than by soldering, such as by vapor deposition, sputtering, and the like.

Figure 6:
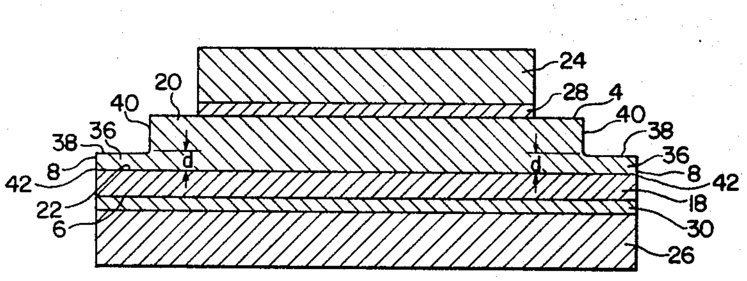

With reference to FIG. 6 a shoulder 36 is formed by removing material of the layer 20 from a portion of the surface 8 by chemical etching, mechanical abrading or by ultrasonic cavitation means and exposes a second side surface 40. It will be understood of course that if the shoulder 36 is formed by mechanical abrasion or ultrasonic cavitation it may also be necessary to employ chemical etching means to remove any damage portion of the semiconductor material.

The peripheral shoulder 36 is defined by the remaining portion of the side surface 8 and a horizontal, or upper, surface 38 formed about the lower portion of the body 2. The shoulder 36 may vary in its width but usually measures about 1 to 1½ millimeters. The inner corner, formed by surfaces 38 and 40, is preferably rounded, in order to minimize both electrical and mechanical stress concentration, with a minimum radius of ~1/64". This minimum radius is achieved during the normal process of producing the shoulder 36.

The surface 38, is of a lesser area than the surface 4 and is at a predetermined distance *d* from the p-n junction 22. The distance *d* is maintained substantially uniformly throughout the entire length and width of the shoulder 36.

The distance *d* is determined by the maximum operating voltage and the allowable breakdown voltage of the finished semiconductor device at an intersection 42 of the p-n junction 22 with the surface 8. Since the operating voltage and the breakdown voltage vary according to operating requirements of the device, the distance *d* will vary accordingly. However, it has been found in making devices capable of sustained operation at a high voltage that *d* should have a maximum value of approximately $$\frac{4\times 10^{15}}{N}$$

microns where N is the doping in atoms per cubic centimeter of layer 20. It has been found that *d* should be as small as can be reasonably controlled during manufacturing operations.

For example, in a 2,000 volt device in which N is equal to $4\times 10^{13}$ atoms per cubic centimeter, *d* should not exceed 100 microns. A *d* value of 50 microns and less has been found satisfactory in such devices.

It should be appreciated by those skilled in the art that a further doping process may be practiced in the layers 18 and 20 of the body 2. Areas of p+nn+ and n+pp+ semiconductivity are such examples. The secondary doping is performed in those portions of the layers 18 and 20 which are immediately adjacent to, and joined to, the metal electrical contacts 24 and 26.

Figure 7:
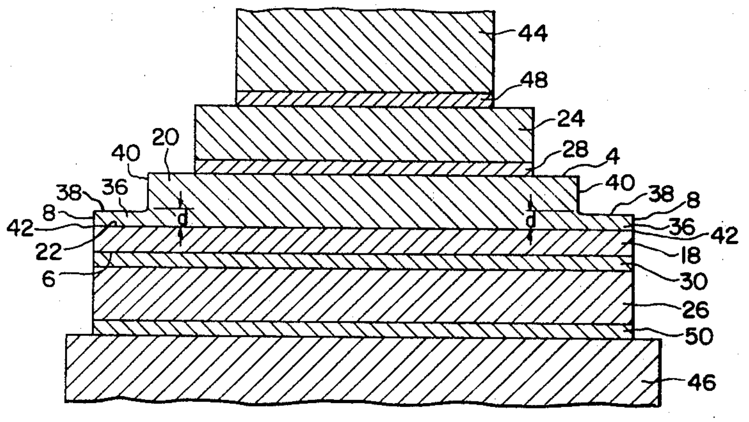
FIG. 7 is a cross-sectional view of a semiconductor device made in accordance with the teachings of this invention.

With reference to FIG. 7, electrical leads 44 and 46 are affixed to the contacts 24 and 26 respectively. The lead 44 may be of a suitable material such for example, as copper, and is affixed to the contact 24 by a layer 48 of a suitable solder. The lead 46, which is of a suitable material, such as copper, is affixed to the contact 26 by a layer 50 of a suitable solder.

The solder layers 48 and 50 comprise a suitable solder such for example as a silver or a gold base solder having a melting point above 372° C. and known to those skilled in the art as a "hard solder." A solder having a melting point below about 372° C., and known to those skilled in the art as a "soft solder," may also be used. Such "soft solders" are usually, but need not be, lead base solders.

It will be understood of course that the particular type of solder will depend on the anticipated operating range of the finished semiconductor device.

The structure shown in FIG. 7 is suitable for use as a high voltage rectifier.

It should be appreciated by those skilled in the art that the remaining portion of the layer 20 could be further divided into two or more regions of the same type semiconductivity. This further division of the layer 20 would permit the making of three and four electrical contact devices.

EXAMPLE I

A semiconductor device suitable for use as a high voltage rectifier was prepared embodying the teachings of this invention.

A wafer of 100 ohm-centimeter resistivity, single crystal, n-type silicon of approximately 20 millimeters in diameter was prepared. The wafer measured 310 microns in thickness after lapping. Damaged layers of silicon material were removed by etching the lapped wafer in a mixture of 19 parts by volume of 70% nitric acid and one part by volume of 49% hydrofluoric acid for approximately four minutes. About 8 microns in thickness of silicon material was removed from each side of the wafer.

The wafer was then oxidized in an atmosphere of wet argon for seven hours at 1200° C. This process yielded an oxide layer almost 2 microns in thickness all around the wafer. The oxidized wafer was cooled at a rate of not greater than 4° C. per minute to room temperature.

The oxide layer was then removed from one side of the wafer by exposing the side to 49% hydrofluoric acid for five minutes. The wafer was then cleaned with deionized distilled water, thoroughly dried, and placed in a quartz tube. The quartz tube was evacuated and backfilled with about 150 torr dry argon and sealed. A slab of silicon carrying a fused aluminum bead was sealed in the quartz tube with the wafer.

A junction depth of about 44 microns in thickness resulted from the aluminum diffusion process carried out at 1227° C. for 16 hours. Cooling to room temperature again was restricted to less than 4° C. per minute.

The diffused layer was suitably masked with wax. The oxide surfaces remained unmasked. The wafer was then exposed to 49% hydrofluoric acid for five minutes to remove the remaining portion of oxide layer. The wafer was then cleaned in deionized distilled water.

A "sandwich" was then prepared comprising first a molybdenum disk one millimeter thick and about 22 millimeters in diameter, then an aluminum-silicon eutectic foil, 25 microns in thickness and about 0.4 millimeter smaller in diameter than the silicon wafer, next came a silicon wafer with the aluminum diffused layer in contact with the foil, and then a gold-0.7 weight percent antimony foil 15 microns in thickness was centrally located on the undiffused surface of the wafer. A mold fusion process was then employed to simultaneously join the contacts to the wafer. Cooling of the wafer to room temperature was limited to less than 4° C. per minute.

The wafer, with the bonded contacts, was then covered with wax. The wax was removed from a selected area to form the shoulder on the surface of the n-type semiconductor material of the wafer. The wafer was exposed to an agitated mixture of 19 parts by volume of 70% nitric acid and one part by volume of 49% hydrofluoric acid. The time of exposure was 75 minutes. The top surface of the shoulder was 80 microns from the p-n junction. The width of the shoulder was approximately 1 to 1½ millimeters.

The completed device was then cleaned in an ultrasonic bath of toluene. The device was then washed in boiling distilled deionized water and baked to dryness.

Electrical leads were then affixed to the device. The device was operated at a sustained voltage of 2000 volts for several hours.

EXAMPLE II

A semiconductor device suitable for high voltage rectifier use was made in a similar manner as the device fabricated in Example I except for the method of forming the shoulder which was by ultrasonic cavitation.

After the contacts were bonded to the wafer the entire wafer was covered wax. The wafer was then suitably jigged and a shaped ultrasonic tool employing 800 grid boron carbide formed a shoulder 1¼ millimeter wide in the n-type portion of the wafer.

The shoulder was then exposed to a mixture of 19 parts by volume of 70% nitric acid at one part by volume of 49% hydrofluoric acid for 4½ minutes completing the structure of the device. The device was then rinsed with distilled deionized water and exposed to a newly made mixture of the same acids for 30 seconds. The device was then cleaned in an ultrasonic bath of toluene washed in boiling distilled deionized water and baked to dryness.

Electrical leads were affixed to the device. The device operated continually at 2000 volts for a period of several hours.

EXAMPLE III

A silicon wafer of 100 ohm-centimeter resistivity, single crystal, n-type silicon of approximately 360 microns of thickness after lapping and about ⅞" OD were prepared. The surfaces were chemically etched with a mixture of 19 parts by volume of 70% nitric acid and one part by volume of 48% hydrofluoric acid for approximately 4 minutes to remove all traces of damaged layers of silicon.

The wafer was then doped with aluminum over the entire exposed surface area to produce a junction depth of about 44 microns. Wax was then applied to one of the surfaces of the wafer. The remaining portion of the doped layer was then removed from the wafer. The wafer was then exposed to another solution of mixed nitric and hydrofluoric acids of the same composition as before for 5 minutes. This acid exposure removed any damaged layers of silicon.

The wafer was then cleaned in an ultrasonic bath of toluene, washed and dried. Contacts were simultaneously joined to both sides of the wafer. The contacts and the method of joining them to the wafer were the same as described in Example I. A peripheral shoulder was formed in the n-type portion of the wafer in the same manner as in Example I and followed by the same cleaning, washing and drying steps.

The completed device was then tested as a high voltage avalanche diode and performed better than those made by prior art methods. The device continued to operate at a constant high operating voltage in excess of 2000 volts for a period of several hours.

Devices made embodying the teachings of this invention are superior to prior art devices for several reasons. The dimensions of the shoulder can be very accurately controlled. Therefore, the electric field at the edge of the junction can be limited to any desired value favorable to the operation and capabilities of the device being manufactured. Also, the structure of the device made by this invention has a higher ratio of active p-n junction area to the total device area available while limiting the electric field intensity at the edge of the device and is not as fragile as some of the prior art devices.

An electrical contact can be attached to the shoulder 36 of the device shown in FIG. 7, while an electrical voltage is applied across the device. The voltage is adjusted enabling one to keep the intensity of the electric field at the intersection 48 of the p-n junction 22 with the surface 8 within safe limits during the normal operation of the device.

While the invention has been described with reference to particular embodiments and examples, it will be understood, of course, that modifications, substitutions and the like may be made therein without departing from its scope.

We claim as our invention:

1. A semiconductor device comprising a body of single crystal semiconductor material, said body of single crystal semiconductor material having a top surface, a bottom surface and a peripheral shoulder about, and integral with, said bottom surface, said peripheral shoulder being approximately 1 to 1.5 millimeters in width, said peripheral shoulder having a top surface of lesser proportion than said top surface of said body, said body of single crystal material having a first layer of a first type of semiconductivity, a second layer of a second type of semiconductivity and a p-n junction formed by an interface of said first layer with said second layer, said first layer of first type of semiconductivity extending from said p-n junction to said top surface of said body including said top surface of said shoulder and said second layer of second type semiconductivity extending from said p-n junction to said bottom surface of said body including the bottom surface of said shoulder.

2. A semiconductor device comprising a body of single crystal semiconductor material, said body of single crystal semiconductor material having a top surface, a bottom surface and a peripheral shoulder about, and integral with, said bottom surface, said peripheral shoulder having a top surface of lesser proportion than said top surface of said body, said body of single crystal semiconductor material having a first layer of a first type of semiconductivity, a second layer of a second type of semiconductivity and a p-n junction formed by an interface of said first layer with said second layer, said first layer of first type of semiconductivity extending from said p-n junction to said top surface of said body including said top surface of said shoulder, said second layer of second type semiconductivity extending from said p-n junction to said bottom surface of said body and said top surface of said peripheral shoulder being a constant predetermined uniform distance from said p-n junction throughout the entire length of said shoulder.

3. A semiconductor device comprising a body of single crystal semiconductor material, said body of single crystal semiconductor material having a top surface, a bottom surface and a peripheral shoulder about, and integral with, said bottom surface, said peripheral shoulder having a top surface of lesser proportion than said top surface of said body, said body of single crystal semiconductor material having a first layer of a first type semiconductivity, a second layer of a second type semiconductivity and a p-n junction formed by an interface of said first layer with said second layer, said top surface of said peripheral shoulder being a constant predetermined uniform distance from said p-n junction throughout the entire length of said shoulder, said predetermined uniform distance having a maximum value equal to approximately $$\frac{4\times 10^{15}}{N}$$

microns, wherein N is the doping value expressed in atoms per cubic centimeter of said first layer of first type semiconductivity, said first layer of first type semiconductivity extending from said p-n junction to said top surface of said body including said top surface of said shoulder and said second layer of second type semiconductivity extending from said p-n junction to said bottom surface of said body.

4. A semiconductor device comprising a body of single crystal semiconductor material, said body of single crystal semiconductor material having a top surface, a bottom surface and a peripheral shoulder about, and integral with, said bottom surface, said peripheral shoulder having a top surface of lesser proportion than said top surface of said body, said body of single crystal semiconductor material having a first layer of a first type semiconductivity, a second layer of a second type semiconductivity and a p-n junction formed by an interface of said first layer with said second layer, said top surface of said peripheral shoulder being a constant predetermined uniform distance not exceeding 50 microns from said p-n junction throughout the entire length of said shoulder, said first layer of first type semiconductivity extending from said p-n junction to said top surface of said body including said top surface of said shoulder and said second layer of second type semiconductivity extending from said p-n junction to said bottom surface of said body.

5. A semiconductor device comprising a body of single crystal semiconductor material, said body of single crystal semiconductor material having a top surface, a bottom surface and a peripheral shoulder about, and integral with, said bottom surface, said peripheral shoulder having a top surface of lesser proportion than said top surface of said body, said body of single crystal semiconductor material having a first layer of a first type of semiconductivity, a second layer of a second type of semiconductivity and a p-n junction formed by an interface of said first layer with said second layer, said first layer of first type of semiconductivity extending from said p-n junction to said top surface of said body including said top surface of said shoulder, said second layer of second type semiconductivity extending from said p-n junction to said bottom surface of said body, said top surface of said peripheral shoulder being a constant predetermined uniform distance from said p-n junction throughout the entire length of said shoulder and at least one electrical contact affixed to said top surfaces of said body.

6. A semiconductor device comprising a body of single crystal semiconductor material, said body of single crystal semiconductor material having a top surface, a bottom surface and a peripheral shoulder about, and integral with, said bottom surface, said peripheral shoulder having a top surface of lesser area than said top surface of said body, said body of single crystal semiconductor material having a first layer of a first type of semiconductivity, a second layer of a second type of semiconductivity and a p-n junction formed by an interface of said first layer with said second layer, said first layer of first type semiconductivity extending from said p-n junction to said top surfaces of said body including said top surface of said shoulder, said second layer of second type semiconductivity extending from said p-n junction to said bottom surface of said body, said first layer of first type semiconductivity is a constant predetermined uniform thickness throughout the entire length of said shoulder, at least one electrical contact affixed to said top surfaces of said body and an electrical contact affixed to said bottom surface of said body.

7. The semiconductor device of claim 2 in which the peripheral shoulder has a rounded inside corner.

8. The semiconductor device of claim 7 in which the radius of the rounded inside corners of the peripheral shoulder is at least approximately one sixty-fourth of an inch.

9. The semiconductor device of claim 3 in which the peripheral shoulder has a rounded inside corner.

References Cited

UNITED STATES PATENTS

| | | | |
|---|---|---|---|
| 2,964,648 | 12/1960 | Doucette et al. | 317—235 |
| 2,993,155 | 7/1961 | Gotzberger | 317—235 |
| 3,076,104 | 1/1963 | Miller | 317—235 |

OTHER REFERENCES

Field-Effect Pinch-Off of Surface Leakage in High Voltage Diodes by T. Kan, published in Solid State Electronics, Pergamon Press, 1961, vol. 2, No. 1, pp. 68–69, printed in Great Britain.

JOHN W. HUCKERT, *Primary Examiner.*

R. F. POLISSACK, *Assistant Examiner.*